(12) United States Patent
Heikkinen et al.

(10) Patent No.: US 10,827,609 B2
(45) Date of Patent: Nov. 3, 2020

(54) ECOLOGICAL MULTILAYER STRUCTURE FOR HOSTING ELECTRONICS AND RELATED METHOD OF MANUFACTURE

(71) Applicant: TactoTek Oy, Oulunsalo (FI)

(72) Inventors: Tero Heikkinen, Oulunsalo (FI); Antti Keranen, Oulunsalo (FI); Mikko Heikkinen, Oulunsalo (FI); Jarmo Saaski, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/711,610

(22) Filed: Dec. 12, 2019

(65) Prior Publication Data
US 2020/0120793 A1    Apr. 16, 2020

Related U.S. Application Data

(63) Continuation of application No. 15/687,157, filed on Aug. 25, 2017, now Pat. No. 10,561,019.

(51) Int. Cl.
*H05K 1/03* (2006.01)
*F21V 3/00* (2015.01)
(Continued)

(52) U.S. Cl.
CPC ............ *H05K 1/0313* (2013.01); *F21V 3/00* (2013.01); *G02B 6/0011* (2013.01);
(Continued)

(58) Field of Classification Search
USPC ...................................... 362/311.02
See application file for complete search history.

(56) References Cited

U.S. PATENT DOCUMENTS

| 5,746,500 A | * | 5/1998 | Chien | ................. A43B 1/0036 36/137 |
| 2011/0018026 A1 | * | 1/2011 | Konno | .................... H01L 33/50 257/100 |

(Continued)

OTHER PUBLICATIONS

Notification of Transmittal of the International Search Report and the Written Opinion of the International Searching Authority, or the Declaration issued by the European Patent Office acting as the International Searching Authority in relation to International Application No. PCT/FI2018/050600 dated Dec. 13, 2018 (10 pages).

(Continued)

*Primary Examiner* — Rafferty D Kelly
(74) *Attorney, Agent, or Firm* — Robert P. Michal, Esq.; Carter, DeLuca & Farrell LLP

(57) ABSTRACT

An integrated multilayer structure for hosting electronics, includes a first substrate including organic, electrically substantially insulating natural material including and exhibiting a related naturally grown or natural textile based surface texture. The first substrate has a first side facing a predefined front side of the structure, the first side of the first substrate being optionally configured to face a user and/or use an environment of the structure or of its host device. The first substrate has an opposite second side, a plastic layer, optionally including thermoplastic or thermoset plastics, molded onto the second side of the first substrate so as to at least partially cover it. The first substrate further includes circuitry provided on the second side of the first substrate, wherein the circuitry is at least partially embedded in the molded material of the plastic layer. A related method of manufacture is also presented.

21 Claims, 4 Drawing Sheets

(51) Int. Cl.
*F21V 8/00* (2006.01)
*H05K 1/02* (2006.01)
*H05K 1/18* (2006.01)
*H05K 3/28* (2006.01)
*H05K 3/46* (2006.01)
*F21Y 115/10* (2016.01)
*F21Y 115/15* (2016.01)

(52) U.S. Cl.
CPC .......... *H05K 1/0269* (2013.01); *H05K 1/0274* (2013.01); *H05K 1/038* (2013.01); *H05K 1/181* (2013.01); *H05K 3/28* (2013.01); *H05K 3/284* (2013.01); *H05K 3/4644* (2013.01); *F21Y 2115/10* (2016.08); *F21Y 2115/15* (2016.08); *H05K 1/0393* (2013.01); *H05K 3/4632* (2013.01); *H05K 2201/0108* (2013.01); *H05K 2201/0129* (2013.01); *H05K 2201/10106* (2013.01); *H05K 2203/1316* (2013.01); *H05K 2203/1327* (2013.01)

(56) References Cited

U.S. PATENT DOCUMENTS

| | | | |
|---|---|---|---|
| 2012/0070921 A1* | 3/2012 | Thompson | B29C 39/006 438/26 |
| 2014/0061684 A1 | 3/2014 | Marutani et al. | |
| 2017/0135198 A1 | 5/2017 | Keranen et al. | |

OTHER PUBLICATIONS

Office Action issued by the United States Patent Office in relation to U.S. Appl. No. 15/687,157 dated Aug. 9, 2018 (6 pages).

Office Action issued by the United States Patent Office in relation to U.S. Appl. No. 15/687,157 dated Dec. 27, 2018 (6 pages).

Office Action issued by the United States Patent Office in relation to U.S. Appl. No. 15/687,157 dated May 13, 2019 (7 pages).

* cited by examiner

ECOLOGICAL MULTILAYER STRUCTURE FOR HOSTING ELECTRONICS AND RELATED METHOD OF MANUFACTURE

CROSS-REFERENCE TO RELATED APPLICATIONS

This application is a continuation of U.S. patent application Ser. No. 15/687,157 filed Aug. 25, 2017, the disclosure which is expressly incorporated herein by reference in its entirety.

The project leading to this application has received funding from the European Union's Horizon 2020 research and innovation programme under grant agreement No 725076.

FIELD OF THE INVENTION

Generally the present invention relates to electronics, associated devices, structures and methods of manufacture. In particular, however not exclusively, the present invention concerns provision of an environmentally friendly, integrated multilayer structure incorporating a substrate with electronic elements and a molded layer provided thereon.

BACKGROUND

Generally there exists a variety of different stacked assemblies and structures in the context of electronics and electronic products.

The motivation behind the integration of electronics and related products may be as diverse as the related use contexts. Relatively often size savings, weight savings, material savings, cost savings, performance gain or just efficient cramming of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, furniture, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and essentially additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

A substrate such as a circuit board or even plastic film may be provided with electronics and overmolded by plastics so as to establish a multilayer structure with the electronics at least partially embedded in the molded layer. Accordingly the electronics may be concealed from the environment and protected against environmental conditions such as moisture, physical shocks, or dust, whereas the molded layer may further have various additional uses in terms of aesthetics, transfer medium, dimensioning, etc.

In terms of ecological thinking and sustainable development, however, many commonly used materials may be sub-optimum as they may contribute considerable additional stress to the environment with reference to associated challenges in waste management due to e.g. slow biodegradation and laborious recyclability. Yet, often aesthetically relatively artificial, cold or dull-looking traditional materials may not fit all use purposes equally well, considering e.g. scenarios where electronics-containing structure shall directly face e.g. use environment and users, being visible to them. Further, in some scenarios electrical or electronic functionality should be brought into maximally close proximity to the use environment, whereupon placing aesthetically more pleasant masking layers on top of e.g. traditional, underlying circuit board hosting electronics is not a preferred solution. Besides, it easily unnecessarily adds to the overall thickness or weight of the solution, which is in many use cases to be avoided if possible.

SUMMARY

The objective of the present invention is to at least alleviate one or more of the above drawbacks associated with the existing solutions in the context of integral multilayer structures and electronics embedded therein.

The objective is achieved with various embodiments of a multilayer structure and related method of manufacture in accordance with the present invention.

According to one embodiment of the present invention, an integrated multilayer structure for hosting electronics comprises a first substrate, optionally being a composite element such as a multilayer laminate, said first substrate comprising organic, electrically substantially insulating natural material, including and exhibiting a related naturally grown or natural textile based surface texture, having a first side facing a predefined front side of the structure, said first side of the first substrate being optionally configured to face a user and/or use environment of the structure or of its host device, and an opposite second side, a plastic layer, such as thermoplastic or thermoset plastic layer, molded onto said second side of the first substrate so as to at least partially cover it, and circuitry, preferably comprising a number of electrically conductive traces, pads, electrodes, and/or at least one electronic, electromechanical and/or electro-optical component, provided on the second side of the first substrate, said circuitry being at least partially embedded in the molded plastic material of the plastic layer.

In various embodiments, the first substrate may comprise or essentially consist of at least one natural and often, but not necessarily, organically grown material selected from the group consisting of: wood, solid wood, veneer, plywood, bark, tree bark, birch bark, cork (comprising phellem layer of bark tissue), natural leather, and natural textile or fabric material (which may be weaved or knitted, or otherwise produced, from natural fibers, for example) such as cotton, wool, linen, silk, or alike. As being clear, some of the above options overlap and may occur simultaneously with reference to e.g. wood and veneer or plywood. In various preferred embodiments, the first substrate indeed comprises or at least primarily consists of organic, biological, biomaterials, or alike, or any combination of these materials with each other and possibly other material(s), optionally carbon-based material(s) and/or various plastics.

In various embodiments, the first substrate may be formable. It may substantially be of formable material(s) such as thermoformable material, or at least comprise a formable layer such as the natural material. Initially potentially substantially planar, e.g. sheet like (extends considerably more in xy direction, whereas the thickness/z dimension is smaller and essentially constant) first substrate may be thus formed utilizing a suitable forming method such as thermoforming to exhibit a desired, at least locally three-dimensional shape (varying thickness, i.e. varying dimensions in z direction) with e.g. protrusion or recess shapes established, prior to molding or during it. Forming may take place after providing at least portion of the circuitry to the first substrate in order to avoid or at least reduce complex 3D assembly of electronics. Forming may still take place prior to molding, e.g. as a separate process step, the plastic layer upon the substrate and circuitry provided thereon to at least partially overmold the same, using e.g. injection molding. However, in some embodiments forming may be executed in connection with molding. To facilitate or enhance such forming with e.g. wooden substrates such as veneer or plywood, the substrate may be first dampened.

In various embodiments, the first substrate or at least a sub-portion such as a wooden, textile, leather or other organic, natural base layer thereof, may be less than about few (e.g. 2-6) mm thick, more preferably less than about 1 mm thick, even more preferably less than about 0.5 mm thick, and most preferably less than about 0.3 mm thick. In case the first substrate contains e.g. the aforesaid textile, leather, or wooden layer of e.g. veneer or plywood, and at least one further layer of e.g. plastic material (a plastic film such as a thermoplastic film, for example), the overall thickness of a resulting substrate construction may still at least locally remain within the above limits or be slightly greater, typically max one or two millimeters greater, depending on the film thickness.

Indeed, as alluded to above, in various embodiments the first substrate may further comprise or be attached to, depending on the viewpoint, one or more additional adjacent, stacked layers such as a coating or primer, and/or a plastic film (laminated or extruded onto the substrate, for example). Such additional layer or element may have been provided for protective, shaping (forming) or strengthening purposes, for instance. Accordingly, the circuitry may be provided directly on the wood, leather, cork, or natural textile type base material of the substrate, and/or upon the coating or laminated film.

In various embodiments, the first substrate or at least a layer thereof in the case of multilayer substrate may define an opening, or generally substrate-free area, through which the underlying molded plastics and/or other features such as a further substrate or other material layer beneath the plastics on the opposite side thereof, are visible. Accordingly, a visual indicator or decoration feature may be established. The opening, such as a through-hole, may be configured to enable light or e.g. some other desired electromagnetic radiation to pass through the substrate layer without being affected by it. As discussed further hereinbelow, in some embodiments the openings such as through-holes may have been filled with e.g. optically transparent or translucent, i.e. transmissive, material to establish related optical vias or windows. The openings or windows may define various shapes, e.g. substantially circular, angular or elongated (e.g. contour or line) shapes.

In various embodiments, one or more of the elements of the structure, including substrate, material layers (e.g. coating, ink, adhesive), circuitry (e.g. traces, components) and/or other features may at least partially, i.e. at least in places, be optically substantially opaque, transparent or translucent having regard to selected wavelengths e.g. in visible spectrum and/or operating frequencies of e.g. light-emitting or—detecting components of the structure. The wavelengths may include wavelengths emitted or received by the electronics of the multilayer structure with reference to e.g. included light-emitting components and light-capturing (e.g. sensing) components, respectively. The transmittance of the concerned element may be about 80%, 85%, 90%, 95% or higher, for example, in case the element is to be considered optically transparent having regard to the wavelengths in question.

With reference to the above, the first substrate may substantially be at least translucent, if not transparent, at least locally so that an underlying light source such as a LED will visibly glow through it. The transparency or transmittance of the substrate material may be adjusted by the material thickness, usually meaning reduced thickness leading into enhanced transmittance and vice versa. For example, many wood materials such as veneer that is usually considered very opaque material may be turned into translucent from a standpoint of close light source by applying layer thicknesses of one or few millimeters only or less. Alternatively or additionally, opaque material may be provided with through-hole type window as discussed above, which is filled with transparent or translucent material, or remains an unfilled opening, to let desired wavelengths of electromagnetic radiation such as visible light to pass through.

In various embodiments, graphics or other visual features may be provided in the structure, e.g. on the substrate surface, by means of e.g. ink or paint defined pigmented shapes. These shapes may be established by printing, for example. Alternatively or additionally, graphics or generally visual (indicator and/or aesthetic) shapes may be provided by duly shaped and light reflecting, refracting, diffracting and/or transmitting surfaces, microstructures, or optical vias/windows (e.g. through-holes with no fill, or with translucent or transparent fill material) in the structure, such as in the substrate, typically on the first (external) side thereof that is visible to the user.

In various embodiments, a number of selected, surface type or embedded, features of the structure such as graphics or openings/windows, or other selected areas or volumes, may be illuminated by underlying light-emitting elements and/or they may be considerably reflect external light such as ambient light or other light incident thereon. The reflectivity may be diffusive and/or specular. Accordingly, illuminated features such as informative symbols, icons or other shapes, optionally indicating e.g. control input location, message or status information, may be established for UI and/or decorative purposes. For instance, a bottom-shooting light source, such as a LED, or OLED may be provided onto the second side and e.g. related second surface of the substrate as at least part of the circuitry to glow through the via/window onto the first side and environment. As a potential related additional advantage, the light source itself may reduce or prevent light leakage possibly otherwise caused by further light sources embedded in the structure.

In some embodiments, opaque (e.g. pigmented) or translucent areas or volumes of the structure such as of the substrate including the organic natural material, other material layers, or further features, may be configured so as to optically at least partially mask selected underlying features such as circuitry from e.g. external visual inspection and having regard to e.g. visible light and/or other wavelengths. The substrate or other layers may thus indeed have desired optical characteristics in terms of exhibited color, transmittance (opaque, translucent, transparent) in view of target wavelengths, etc.

In various embodiments, the circuitry may generally refer to a number of features such as traces (wiring), contact pads, electrodes and/or other type of electrical conductors or generally conducting elements, or components, provided upon the surface of, within or otherwise in connection with the substrate. Yet, in various embodiments, the circuitry may comprise at least one component selected from the group consisting of: electronic component, electro-optical component, electromechanical component, radiation-emitting component, light-emitting component, LED (light-emitting diode), OLED (organic LED), side-shooting (emitting) LED or other light source, top-shooting LED or other light source, bottom-shooting LED or other light source, radiation detecting component, light-detecting component, photodiode, phototransistor, photovoltaic device such as cell, sensor, micromechanical component, switch, touch switch, proximity switch, touch sensor, proximity sensor, capacitive switch, capacitive sensor, projected capacitive sensor or switch, single-electrode capacitive switch or sensor, multi-electrode capacitive switch or sensor, self-capacitance sensor, mutual capacitive sensor, inductive sensor, sensor electrode, UI element, user input element, vibration element, communication element, data processing element such as a controller or a processor, and data storage element such as a memory chip. Still, an electronic sub-assembly with e.g. a circuit board and component(s) of its own may be provided on the substrate(s) and/or other layers of the structure.

In various embodiments, the circuitry as well as other potential features may be provided onto a target substrate layer (e.g. onto the surface of the aforementioned natural material or of a coating or film provided thereon earlier) through utilization of printed electronics technology such as screen printing or ink jetting. Alternatively or additionally, a number of other technologies may be exploited with reference to mounting (e.g. SMT, surface-mount-technology), laminating or transfer laminating, depositing, etc. Similarly, other features such as supplementary components, e.g. lightguides, or graphics, may be provided. The provided components may have been packaged using a suitable packaging technology as being readily understood by a person skilled in the art. Still, e.g. mountable components may be provided on previously printed or otherwise provided conductive traces, pads or other contact areas on the substrate.

In various embodiments, a second substrate or other, potentially composite, element is also provided on the opposite side of the molded plastics. In many use scenarios and related embodiments, the first substrate can be considered as the front substrate, in a sense that it may be positioned closer to a user and use environment of the structure, and remain potentially visible to the user at least having regard to surface thereof, whereas the second substrate is often located on the back side of the structure facing e.g. a host device or host structure, but also reverse or some other alignment of the substrates relative to the user and/or host device is technically feasible in some other embodiments and use scenarios as being easily understood by a person skilled in the art. The first and second substrates may be mutually similar (see e.g. the list above) or different having regard to their dimensions, materials, shapes, holes and/or other features such as components or generally circuitry hosted. Generally, the above considerations regarding the first substrate thus also apply to the second one. In some embodiments, the second substrate may comprise or essentially consist of plastic material such as thermoplastic, thermosetting or other polymer, or it may comprise organic material such as wood-based material (e.g. veneer, plywood, bark or cork).

In various embodiments comprising two substrates, they may be positioned, i.e. inserted, in opposing sides, or halves, of a mold enabling at least one plastic material (as they may be several intermediate molded materials/layers, which may be provided by multi-shot molding, for example) to be injected between them to establish the multilayer stack optionally in one go. Alternatively, the second substrate may have been laminated onto the molded layer by feasible lamination technology using e.g. adhesive, elevated temperature and/or pressure based bonding. In some embodiments, the second substrate is electrically connected to the first substrate by conductive material between them. Additionally or alternatively, the substrates or features, such as electronic components or other circuitry thereon may be electrically or electromagnetically connected to each other or e.g. external elements such as a user's hand, finger or (other) stylus wirelessly by means of related electromagnetic field or flux.

A plurality of substrates and/or other layers on any side of the molded plastic layer may be attached together through lamination (heat, pressure, adhesive, etc.) and/or by mechanical fixing means, for instance. The layers may be flexible (bend reversibly) or essentially non-flexible or stiff (plastic deformation).

In various embodiments, the first and/or second substrate(s) may exhibit a planar shape in the finished structure. However, the concerned shapes may alternatively be at least locally essentially three-dimensional and be established through forming such as thermoforming or cold forming to be discussed in more detail hereinafter.

In various embodiments, a number of vias through material layers such as substrate(s) and or molded layer(s) have been provided or essentially filled with electrically conductive material that is further preferably formable to survive e.g. (thermo)forming of the host material without suffering from at least excessive breakage having regard to desired properties thereof such as electrical conductivity.

In various embodiments, the multilayer structure comprises at least one optically transmissive element such as an optical waveguide, or specifically a lightguide, configured, e.g. in terms of dimensions, materials (e.g. associated refractive indexes, transmittance), etc., so as to direct light incoupled thereto in a desired manner. The lightguide may for example guide the incoupled light to a selected direction for outcoupling via a selected exit surface thereof or reaching e.g. a photosensitive sensor or other optically functional element provided within, adjacent or at least optically coupled to the lightguide. The lightguide may be at least partially manufactured on a substrate (e.g. the first, second or other substrate) or some other layer of the structure by printing, or provided as a ready-made element (attached by lamination, for example).

In various embodiments, the structure comprises a further, second molded layer that has been provided on the second side and potentially at least locally contacting the associated second surface of the second substrate. The material of the second molded layer be the same with the first molded layer on the opposite first side, or different. Also same or different molding techniques or parameters may have been utilized for producing the layers.

Optionally, as mentioned hereinbefore multi-material capable molding technology such as multi-shot molding may be utilized to provide several plastic layers in one process, which may also be applied to producing selected molded layer(s) of the multilayer structure suggested herein.

Generally, in various embodiments the plastic layer(s) molded onto any of the substrates included in the multilayer structure may comprise materials such as polymer, organic, biomaterial, composite, such as organic or graphite, as well as any feasible combination thereof. The material(s) may be or at least comprise thermoplastic material. Alternatively or additionally, the molded layer(s) may consist of or at least comprise thermosetting material.

In various embodiments, the used molding techniques for producing material layers in the structure may vary but include e.g. injection molding and reactive molding such as reaction injective molding. The molding process may optionally be of the aforementioned multi-material and/or as multi-shot type. Low-pressure molding may be applied to prevent damaging the underlying electronics by excessive pressure, for example. Optionally, several molding materials may be utilized to establish one or more molded layers, e.g. adjacent layers lying side-to-side on a substrate and/or a stack of multiple superposed layers thereon. One or more components and/or other circuitry established (printed, for example), mounted or otherwise provided to any side of the substrate, may have been at least partially overmolded by the introduced procedure.

In some embodiments, material(s) used to establish the molded layer(s) comprises optically substantially opaque, transparent or translucent material. Transparent or translucent material may be selected so as to enable e.g. visible light or electromagnetic radiation of other selected wavelengths to pass through the molded material with negligible loss. The sufficient transmittance at desired wavelengths may be about 80%, 85%, 90% or 95% or higher, for example. Other applied molded (thermo)plastic material may be substantially opaque or translucent having regard to selected wavelengths.

Yet, a system comprising an embodiment of the multilayer structure and an embodiment of optionally host type structure or device accommodating or at least functionally connecting to the multilayer structure may be provided.

The optionally host type and operatively and/or physically (e.g. mechanically) connected structure or device may include at least one element selected from the group consisting of: electronic terminal device, portable terminal device, hand-held terminal device or controller, vehicle, car, truck, airplane, helicopter, in-vehicle electronics, vehicle dashboard, vehicle exterior, vehicle interior panel, vehicle dash panel, vehicle door panel, lighting device, vehicle lighting device, furniture, construction or decoration element, measurement device, computer device, intelligent garment (e.g. shirt, jacket, or trousers, or e.g. a compression garment), other piece of wearable electronics (e.g. wristop device, headwear, or footwear), multimedia device or player, industrial machinery, controller device, personal communications device (e.g. smartphone, phablet or tablet) or other electronics.

According to one other embodiment of the present invention, a method for manufacturing a multilayer structure, comprises obtaining a first substrate, optionally being a composite element such as a multilayer laminate, said first substrate comprising organic, electrically substantially insulating natural material, including and exhibiting a related naturally grown or natural textile based surface texture, having a first side to preferably face a predefined front side of the structure, said first side of the first substrate being optionally configured to face a user and/or use environment of the structure or of its host device, and an opposite second side, providing, optionally by mounting and/or by printed electronics technology, circuitry on at least said second side of the first substrate, and molding plastic material on the second side of the first substrate so as to at least partly cover it and the circuitry.

As alluded to hereinbefore, in some embodiments, further substrates, other material layers and/or features may be provided in the structure, used e.g. as an insert in a molding procedure, laminated onto an existing layer, or established directly into the structure by molding or printing, for example.

Thereby, e.g. a second substrate, optionally a plastic film, may be optionally provided on the other side of the molded plastic as mentioned hereinbefore. It may be located in a mold together with the first substrate so that a stacked structure is obtained by injecting the plastic material in between, or the second substrate may be provided afterwards using a suitable lamination technique if not being directly manufactured on the molded plastic layer. The second substrate may also have electronics on any side thereof (e.g. facing the molded plastic layer) as well as e.g. graphics (application of e.g. IML technique being thus possible). Yet, it may have a protective purpose and/or other technical features such as desired optical transmittance, appearance (e.g. color) or feel.

In some embodiments, as mentioned hereinbefore the first and/or a further, e.g. said second, substrate may be provided with additional layers such as e.g. coating such as primer or (plastic film) on either side thereof. The first substrate, second substrate and/or additional layers provided thereto may essentially comprise single material only or be of composite type. Yet, the circuitry may be stacked. For example, conductive traces and/or pads may be first provided on a substrate and a number of components may be then arranged upon the traces/pads.

The feasible molding methods include e.g. injection molding in connection with e.g. thermoplastic materials and reactive molding such as reaction injection molding especially in connection with thermosets. In case of several plastic materials, they may be molded using a two-shot or generally multi-shot molding method. A molding machine with multiple molding units may be utilized. Alternatively, multiple machines or a single re-configurable machine could be used for sequentially providing several materials. Having regard to applicable molding techniques and parameters, e.g. the aforementioned injection molding and reactive molding are indeed feasible options depending on the used materials, desired material properties, etc. To cause minimum stress to the underlying features such as electronics, low-pressure (e.g. less than about 10 bar) molding may be used in selected molding operations, such as overmolding of the second side of the first substrate as well as circuitry thereon. Different molding techniques may be applied to yield different material properties to the structure in terms of e.g. desired mechanical properties such as strength.

In various embodiments, one or more substrates and/or other material layers of the resulting structure may be formed, optionally thermoformed, to exhibit a desired, typically at least locally three-dimensional, instead of substantially flat, target shape preferably following the provision of circuitry such as a number of components, electrodes, conductors and/or contact pads thereon. The material, dimensions, positioning and other configuration of the elements such as electronics already residing on the substrate prior to molding shall be selected so as to withstand the forces induced thereto by forming without breakage. Forming may facilitate integrating the structure within a host device or structure, for example.

In various embodiments, also the second side and related second surface of a possible second substrate may be overmolded at least partly by at least one material. For example, low-pressure molding may be utilized to protect underlying elements such as components or other circuitry as contemplated hereinearlier.

The electronics provided in the multilayer structure may have control, measurement, UI, data processing, storage, etc. purpose as discussed hereinelsewhere.

The mutual execution order of various method items may vary and be determined case-specifically in each particular embodiment. For example, the second side of a potential second substrate may be overmolded prior to the first side (the first side of the second substrate thus facing the second side of the first substrate, having molded material in between), after the first side or substantially simultaneously; for instance, molded material may be injected so that it propagates from the initial side to the opposite side of the second substrate e.g. via an existing or pressure-induced through-hole therein.

The previously presented considerations concerning the various embodiments of the multilayer structure may be flexibly applied to the embodiments of the related manufacturing method mutatis mutandis, and vice versa, as being appreciated by a skilled person. Yet, various embodiments may be flexibly combined by a person skilled in the art to come up with preferred combinations of features generally disclosed herein.

The utility of the present invention arises from a plurality of issues depending on the embodiment. Stacked, sandwiched structures with at least one substrate layer, molded layer and electronics layer in between for building various electronic devices and arrangements e.g. in the general context of injection-molded structural electronics may be established using environmentally friendly, preferably renewable and easily recyclable, natural materials such as real wood, real leather, and natural textiles.

Accordingly, the natural appearance, feel and/or other preferred properties of such materials such as durability and protectiveness may be harnessed into use in connection with functional structures containing also electronics. Indeed, in some embodiments the materials may establish at least part of an outer surface, or at least of near-surface layer, of the structure or related host device. This may, in turn facilitate, e.g. visually seamless integration of the electronic functionalities with various target devices, structures and surfaces e.g. in vehicles with reference to interior. Still, the structure may be kept relatively thin and light because the natural material is also applied as substrate material for electronics and potentially further features. Thinness may yield supplementary benefits regarding e.g. distance between embedded electronics such as sensing electronics and the environment, which should be in some use scenarios minimized or at least remain within a certain limit.

The suggested manufacturing method applying overmolding is relatively straightforward to adopt and what is further considered beneficial, does not necessitate developing completely new or particularly complex manufacturing technologies if relying on e.g. printed and in-mold electronics. By (thermo)forming the substrate(s) to a desired 3D shape after the provision of electronics such as components and e.g. traces thereon while the substrate was still substantially planar, may further reduce or obviate a need for burdensome 3D assembly of electronics on a substrate and other 3D intensive processing.

Generally, the obtained multilayer structure may be used to establish a desired device, or e.g. a module in a host device or host structure such as an intelligent garment (e.g. shirt, jacket, or trousers, or e.g. a compression garment), other piece of wearable electronics (e.g. wristop device, headwear, or footwear), vehicle such as vehicle exterior or interior element (e.g. in-vehicle electronics embedded in interior panels, dashboard or other surfaces), personal communications device (e.g. smartphone, phablet or tablet, or smart cover thereof), a sensor, or other electronics as described herein. The integration level of the obtained structure may be high and desired dimensions such as the thickness thereof small.

The used material layer(s) such as the substrate(s) may be configured to carry graphics and other visually and/or tactilely detectable features thereon in addition to their nature texture (considering e.g. leather, wood or fabrics, which may have distinct, characterizing graphical character of their own, such as leather pattern or wood grain). Materials included in the multilayer structure may exhibit a desired color. The structure may thus generally incorporate one or more color/colored layers that optionally determine graphics such as text, pictures, symbols, patterns, etc.

The molded plastic material(s) may be optimized for various purposes including securing and protecting the embedded electronics as well as connecting to external devices or generally structures. For example, the material may be configured to protect the electronics from e.g. environmental conditions such as moisture, heat, cold, dirt, shocks, etc. It may further have desired properties in view of light transmittance and/or elasticity, for example. In case the embedded electronics includes light- or other radiation-emitting or receiving components, the material may have sufficient transmittance to enable e.g. light transmission therethrough. The molded material may originally exhibit a number of colors or it may be colored afterwards by ink, paint, film, composite, or alike, coating, for example.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
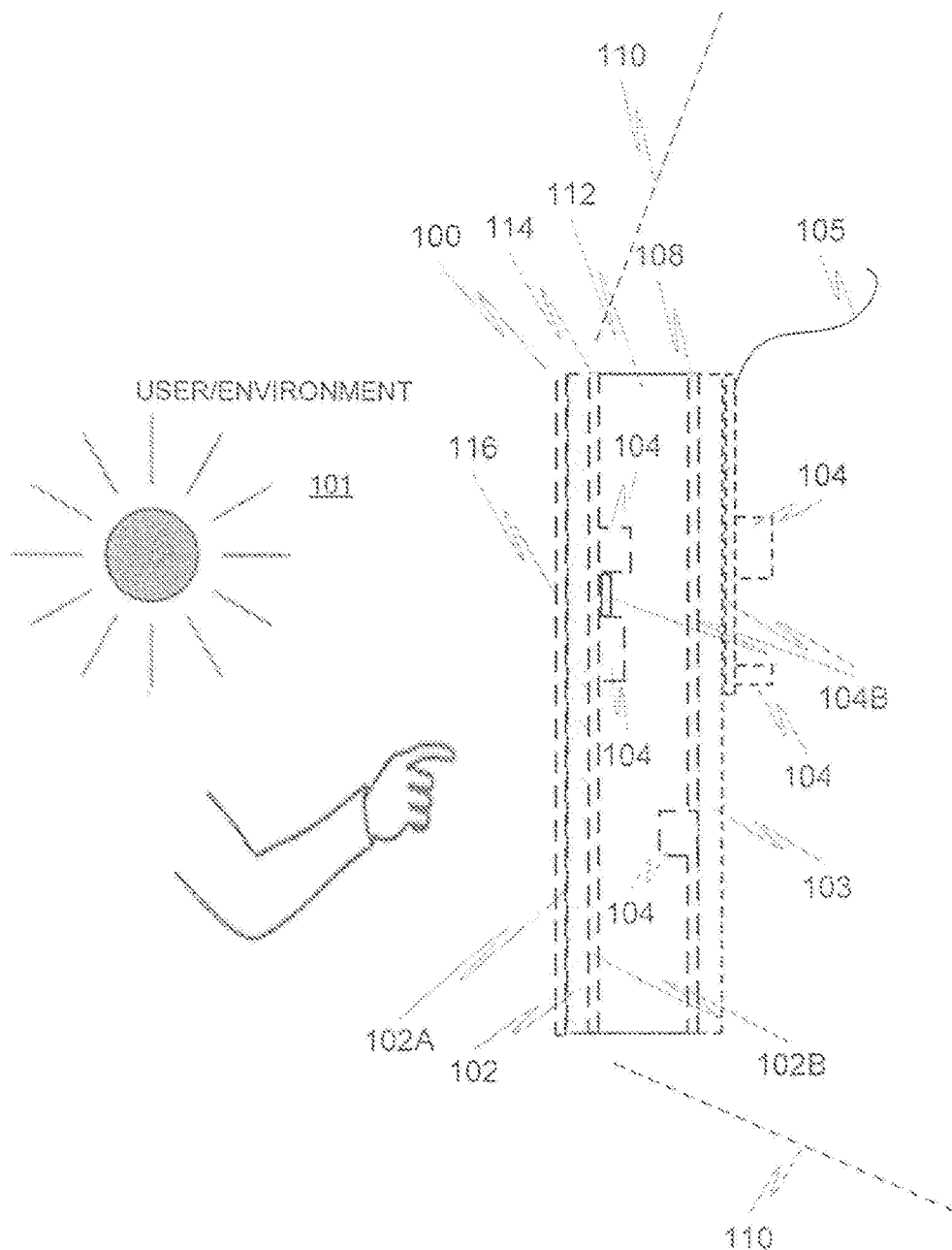
FIG. 1 illustrates one embodiment of a multilayer in accordance with the present invention.

FIG. 1 illustrates, by means of a cross-sectional side view, many general concepts of various embodiments of the present invention via one, merely exemplary, realization of a multilayer structure at 100. Item 101 refers to potential use environment (outdoors, indoors, in-vehicle, etc.) and potential human user (if any) of the structure 100 located in the environment, whereas item 110 indicated by broken contour lines refers to a host device or host structure 110.

The finished multilayer structure 100 may indeed establish an end product of its own, e.g. electronic device, or be disposed in a host device as an aggregate part or module, such as a panel with both decorative and functional motive. It 100 may naturally comprise a number of further elements or layers not shown in the figure.

The structure 100 contains at least one substrate 102 as discussed hereinbefore. The substrate 102 consists of or at least comprises organic, natural material as discussed hereinbefore with reference to e.g. wood, leather or natural textile materials. Optically the material is typically substantially opaque or translucent, depending on e.g. the thickness of the applied material layer. The substrate 102 has first 102A and second 102B sides and related surfaces. The first side/surface 102A may face the environment and user therein, for example, whereas the second side/surface 102B may then face the structure internals.

The substrate 102 may be provided with a single material layer only or it may refer to a laminate or composite of several materials and/or material layers. The substrate 102 may incorporate or neighbour, in addition to primary natural material, e.g. a (sub-)layer 114, which may refer to single material or composite coating (e.g. primer) or e.g. plastic film, or alike, which may in turn directly accommodate the circuitry 104. Additionally or alternatively, at least one additional front layer 116 of e.g. plastics and/or other, potentially composite, material (e.g. transparent or translucent, or window/through-hole containing, layer at least in places) may be included e.g. for protection, feel and/or aesthetic purposes. The circuitry 104 may refer to e.g. printed electronics layer of traces and e.g. contact pads establishing a certain circuit layout and a number of electronic components accommodated by the layout. The substrate 102 may be a film-like thin and optionally flexible (e.g. bendable) element or a more rigid and thicker element, for instance. In the shown case, the substrate 102 and the overall structure 100 are both substantially planar, but as shown in the forthcoming figures, 3D shapes are fully feasible and common, and may be achieved by means of forming such as thermoforming, for example.

The circuitry 104 may, in addition to e.g. printed or mounted components, specifically comprise a number of connecting elements 104B such as contact pads and/or electrically conductive traces (conductors) provided, optionally by printed electronics technology, to arrange e.g. electrical connections to and/or between the components. The contact pads as well as other conductors or traces, or e.g. (electrical) shielding elements, may comprise or be made of conductive material, such as copper, silver, aluminum, or conductive elastomer, comprising e.g. carbon or other conductive particles, or other such materials which may optionally enhance the visual quality of the surface on or within which the pad resides. The shape of the contact pads may be any suitable geometric shape.

In addition to or instead of printed versions, the components may include ready-made components (surface-) mounted on the substrate 102, such as so-called surface-mounted elements. For example, adhesive may be utilized for mechanically securing the electronics on the substrate. Additional conductive material(s) such as conductive adhesive and/or solder may have been applied for establishing electrical and also mechanical connections between various elements such as conductor traces and components.

The components 104 may include passive components, active components, packaged components, ICs (integrated circuit), printed, such as screen printed, components and/or electronic sub-assemblies. For instance, one or more components may be first provided on a separate substrate, e.g. a circuit board such as an FPC (flexible printed circuit) or e.g. rigid, e.g. FR4 type (flame retardant), board, and subsequently attached as a whole (i.e. as a sub-assembly) to the target substrate 102.

Reverting to the circuitry 104 preferably of at least partially electronic or electrical nature, they may, among other options, include at least one electronic component selected from the group consisting of: optoelectronic component, microcontroller, microprocessor, signal processor, DSP (digital signal processor), sensor, switch, touch switch, proximity switch, programmable logic chip, memory, transistor, resistor, capacitor, inductor, capacitive switch, electrode element, memory array, memory chip, data interface, transceiver, wireless transceiver, transmitter, receiver, wireless transmitter, and wireless receiver.

Still, the components of the circuitry 104 hosted by the structure 100 may include at least one optoelectronic component. The at least one optoelectronic component may include a LED (light-emitting diode), an OLED (organic LED), or some other light-emitting component, for example. The components may be side-shooting (i.e. side-emitting, or 'side-firing'), bottom-shooting or top-shooting. Alternatively or additionally, the components may include a light-receiving or light-sensitive component such as a photodiode, photoresistor, other photodetector, or e.g. a photovoltaic cell. The optoelectronic component such as OLED may have been, instead of mounting, printed on the substrate 102 using a preferred method of printed electronics technology. Indeed, e.g. different sensing and/or other functionalities may be implemented by the embedded ICs, dedicated components, shared ICs/electronics (multi-purpose electronics), and/or other circuitry. A component may be positioned in the structure 100 and the structure 100 be generally configured so that the component can interact with the environment 101 to a sufficient degree. For example, material type, texture and thickness of substrate 102 may be selected so as to enable light emitted by a component to pass through it and glow visibly when perceived by the user. In some cases the substrate 102 may be provided with openings such as through-holes or e.g. windows filled with preferably transparent or translucent material for the purpose, whereas in some cases maintaining the thickness of the substrate 102 small enough may suffice to enable the light emitted by underlying, preferably closely positioned, light source to pass through.

Molded plastic layer 112 is provided at least on the second side 102B of the substrate 102. Accordingly, components, other circuitry 104 such as traces 104B and/or further features may be at least partially embedded in the molded material 112. The used molding techniques and parameters may vary depending on the embodiment and even within an embodiment if containing multiple sequentially molded layers. To avoid causing pressure or thermal damage to circuitry 104, for example, low pressure molding (e.g. preferably less than about 15 bar pressure, more preferably less than about 10 bar) may be utilized to embed them. Optionally, also high(er) pressure molding may be subsequently applied to introduce further layers to the stacked structure 100.

The layer 112 may generally incorporate, among other options, elastomeric resin. In more detail, the layer(s) 112 may include one or more thermoplastic materials that include at least one material selected from the group consisting of: PC, PMMA, ABS (acrylonitrile butadiene styrene), PET (polyethylene terephthalate), nylon (PA, polyamide), PP (polypropylene), TPU (thermoplastic polyurethane), polystyrene (GPPS), TPSiV (thermoplastic silicone vulcanizate), and MS resin. In some embodiments, thermoset materials may be alternatively or additionally utilized together with suitable molding methods such as reactive molding.

An optional second substrate 103 of e.g. natural material same or similar to the one of first substrate 102, or different material such as plastics (e.g. thermoplastic film), a composite material, or alike, may be present in the multilayer stack 100 as well. The second substrate 103 may, just like the first substrate 102, also accommodate electronics 104, graphics and/or other features considered advantageous, on any side thereof. The substrates 102, 103 may be functionally, such as electrically, connected together by intermediate connecting elements such as conductive material optionally embedded in plastics 112.

Further films and/or other material layers such as graphics or colored films or layers, coatings, carbon fiber, etc. 108 may further be optionally provided on any side of the second substrate 103 (only shown on the first side for clarity) e.g. for aesthetic, protective/insulating, electrical and/or other purposes, again similar to the first substrate 102.

As alluded to above, the structure 100 and specifically e.g. electronic circuitry 104 integrated therewith may be operatively connected, instead or in addition to possible mechanical fixing, to external elements such as the host device or structure 110 wirelessly (e.g. by means of optical, ultrasound, radio frequencies, capacitive or inductive coupling) and/or wiredly. In the latter case, a number of suitable connecting elements 105 such as electrical or optical wiring, connectors, cables, etc. may be utilized. E.g. power and/or control signals may be transferred via such elements 105 in desired direction.

In various embodiments, the connecting element 105 may comprise a circuit board such as a printed circuit board optionally of flex or rigid (e.g. FR4) type. In various embodiments, the connecting element 105 may comprise at least one electronic component, such as a transistor or an integrated circuit (IC), e.g. an operational amplifier (which could naturally also be constructed from individual components).

The connecting element 105 may be thus configured to accommodate components that are harder or practically impossible to mount or fabricate on a natural substrate, for example. The connecting element 105 may be secured to a substrate 102, 103 (by mere example, in the shown case the element 105 is connected to substrate 103/elements 104B thereof) using e.g. adhesive, paste, conductive adhesive, mechanical fixing means, etc. E.g. electrical connection between the actual circuit design on the substrate 102, 103 and the connecting element 105 may be implemented, for example, by the same or dedicated feature such as solder, conductive adhesive or paste, wiring, contact areas/pads, pins, flex cable and/or element of anisotropic material having regard to electrical conductivity, optionally ACF (anisotropic conductive film).

Having regard to the material selections, the second substrate 103 may substantially consist of or comprise at least one material selected from the group consisting of: polymer, thermoplastic material, PMMA (Polymethyl methacrylate), Poly Carbonate (PC), polyimide, a copolymer of Methyl Methacrylate and Styrene (MS resin), glass, Polyethylene Terephthalate (PET), carbon fiber, organic material, biomaterial, leather, wood, textile, fabric, metal, and alike. The material(s) used may be at least locally electrically conductive or more typically, insulating. Yet, the optical properties may vary depending on the embodiment having regard to opacity/transparency, transmittance, etc.

The material layers such as first substrate 102 and optional second substrate 103 may be processed and shaped according to the requirements set by each use scenario. They 102, 103 may exhibit e.g. a rectangular, circular, or square general shape. They 102, 103 may be substantially imperforate or contain recesses, notches, vias, cuts or openings, optionally filled with other material(s), for various purposes such as attachment to other elements, conducting electricity and e.g. related electrical power or other signals, fitting electronics or other components, provision of passages or thinned portions for light or other radiation, fluid, etc.

The substrate(s) 102, 103 as well as plastic layer(s) 112 or potential further layers 108, 114, 116 (paint, ink, film(s), etc.) may be configured to exhibit a desired color or graphical pattern, which may be externally perceivable. For example, IML (in-mold labeling) procedures may be utilized to arrange embedded graphics in the structure 100.

Figure 2:
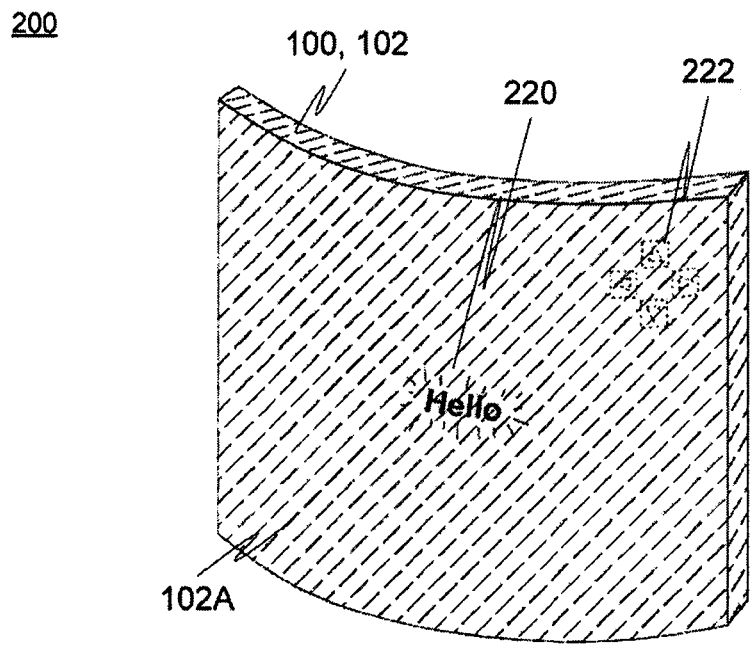
FIG. 2 illustrates one embodiment, such as the one of FIG. 1, of the multilayer structure via axonometric sketch depicting essentially front side thereof, facing the environment and user.
Figure 3:
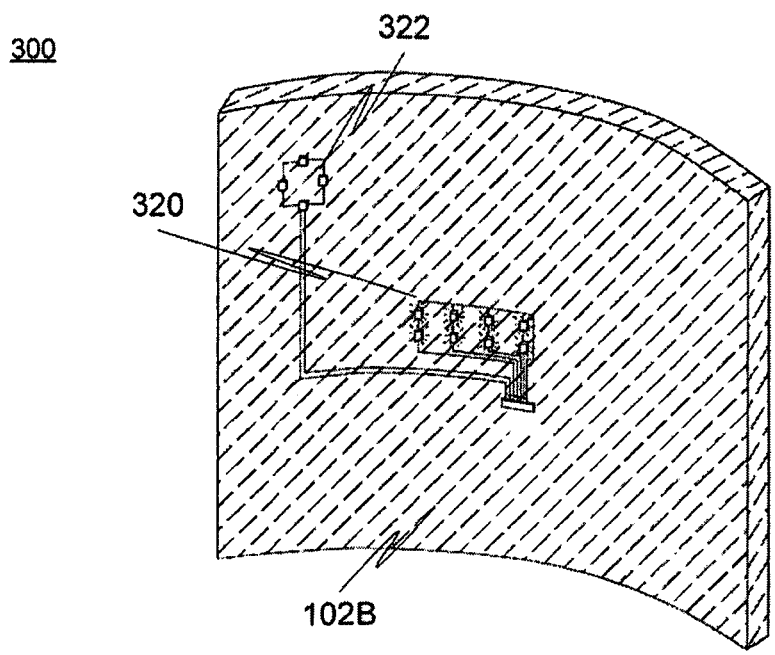
FIG. 3 illustrates the embodiment of FIG. 2 from opposite, back side.

FIG. 2 coarsely illustrates, at 200, one embodiment of the multilayer structure, such as the one of FIG. 1, via axonometric sketch depicting essentially a front side thereof, facing the environment and user. FIG. 3 correspondingly illustrates, at 300, a potential back side via a related coarse sketch. From both figures, molded layer 112 and potential further layers and many other optional features discussed hereinelsewhere have been omitted for clarity as being appreciated by a person skilled in the art. From the figures, substantially three-dimensional and non-planar, curved, overall shape of the natural material-containing substrate 102 can be easily seen.

The front face of the structure 100 depicts a glowing visual indication (in the shape of word "Hello") 220, which may have been produced by providing circuitry 320 including light sources such as a number of LEDs or OLEDs on the backside of the substrate 102, optionally together with e.g. duly shaped lightguide(s) conveying such light, during manufacturing by mounting, transfer lamination and/or printing, for example. The circuitry 320 may have been provided prior to forming of initially substantially planar substrate 102 to avoid 3D assembly of electronics. The glow may have been enabled by placing a sufficiently strong light-sources, such as bottom-shooting LEDs, onto the second side 102B (and respective surface of natural material such as wood, leather or textile, or on a surface of adjacent further layer such as coating/primer or e.g. plastic film) of the substrate 102. By physical configuration such as positioning and alignment of the light source(s) and potential further integrated features to be illuminated, such as lightguides, through-holes, filled windows, thinned portions, graphics and/or material texture of the substrate 102, the nature such as shape of the indication 220 may be tailored to each purpose. The indication 220 may exhibit text, numbers, symbols, icons, graphical patterns, figures, etc.

The indication 220 may have a decorative and/or functional (e.g. informative, e.g. message or status indicator, as a part of the UI) purpose.

Alternatively or additionally, UI (user interface) and especially a number of control input features 222 such as touch or gesture input features accessible (usable) via the first side 102A may be at least partially enabled by the embedded circuitry 322 on the other (second) side 102B of the substrate 102 instead of or in addition to output type indicator 220. The circuitry 322 may include e.g. a number of light-sources for illuminating the features 222 in a selected manner (e.g. brightness, lighting sequence, selective control) when active and/or upon detected input. Yet, the circuitry 322 may include gesture or touch detection elements such as capacitive sensors and/or other sensors that may have been mounted, printed, and/or otherwise provided on the second side 102B. The configuration of the circuitry 322 and potential further features related to the provision or illumination of features 222 may be generally implemented as described above relative to indication 220, for instance.

As illustrated in the figure by the diagonal striping patterns of dotted lines, the natural material of the substrate 102 shall advantageously exhibit its natural appearance with characterizing texture to an extent that it is at least in places visible to the environment and perceivable by a user therein notwithstanding the fact the front face (first side 102A) of the substrate 102 may be provided with e.g. protective coating by varnishing or lamination (e.g. film), for example. As contemplated hereinbefore, also the second side 102B of the substrate 102 may be provided, besides the molded plastic layer, with a number of additional layers of single or composite material, e.g. plastic, carbon fiber, or alike.

Having regard to various different potential embodiments of the structure 100, related substrate(s) 102, 103, material layers/coatings 108, 112, 114, 116, circuitry 104 (e.g. conductor traces, pads, components), and/or other features 430A, 430B (e.g. thinned portions, filled windows, through-holes), etc., the associated shapes may be selected as desired in accordance with the requirements of each particular use case. For example, rounded or curved, linear, angular, elliptical, triangular, hexagonal, octagonal, rectangular, square shapes, other geometric shapes, or alike, are feasible. The shapes may establish or resemble e.g. numeric, textual, geometrical and/or graphical ensembles.

Figure 4:
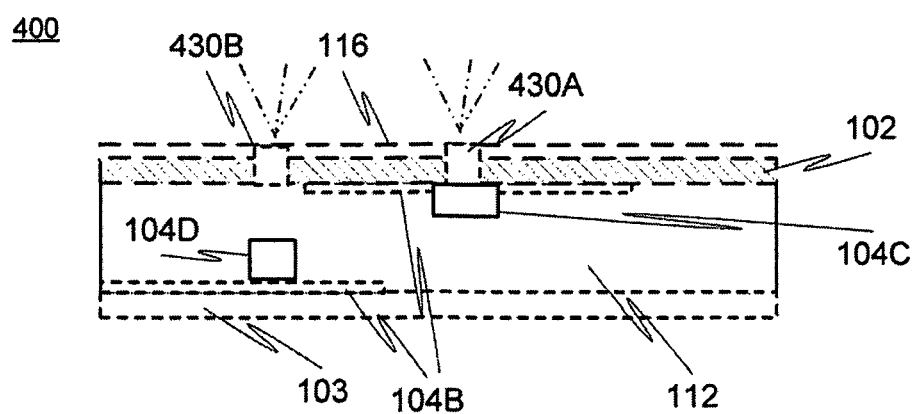
FIG. 4 illustrates a further embodiment of the multilayer structure, or essentially extension of the embodiment of FIG. 1, in accordance with the present invention.

FIG. 4 illustrates, at 400, a further embodiment of the multilayer structure in accordance with the present invention. This embodiment may be considered a tailored version of the previous one, whereupon various features of the two embodiments may be flexibly and selectively combined to come up with further embodiments as being understood by a person skilled in the art.

The first substrate 102 comprising natural material such as veneer or e.g. plywood may be provided with power/control signals transferring traces 104B and at least one light-emitting component, such as a reverse mounted (bottom-shooting) LED, 104C. In some embodiments, at least one additional surface layer 116 such as coating or film may be provided on the natural material for protection, aesthetics/decoration, and/or feel. The light source 104C of substrate 102 may be configured to emit a characterizing first color. The natural material of the substrate layer 102 and potentially additional layer(s) thereof may optionally further contain at least one transmissive feature 430A with reference to e.g. a through-hole established by a laser cutter or drill, for example, being optionally filled with optically transmissive such as transparent or translucent material to enable the light emitted by the light-source 104C to pass through the natural material and visibly illuminate e.g. the shape, such as icon, symbol, letter or number, established by the feature.

The structure may further contain, on the other side of the molded plastics 112, a further substrate 103 of e.g. natural material such as wood, or e.g. a plastic film, accommodating e.g. traces 104B and circuitry such as at least one further light-source, e.g. LED 104D. Respectively, for the light emitted by the light-source 104D, optionally of different second color, the first substrate 102 may contain an optionally dedicated optically transmissive feature 430B such as at least one through-hole or window filled with suitable material. The light emitted by source 104D may be thus utilized to illuminate other surface areas/features of the structure than illuminated by the source 104, and/or emit different color. Conveniently, the source 104C of the first substrate 102 may also block the light emitted by the source 104D from entering the feature 430A to avoid undesired light leakage or mixing. Therefore, effective means for light management may be achieved without excessive number of features or unnecessary light leakage/pollution between different light sources 104C, 104D and illuminated features.

In some embodiments, source(s) 104D may be utilized to illuminate larger surface areas defined on the first substrate 102, e.g. contours, while closer-to-target situated source(s) 104C are utilized for more spot like illumination of possible different, smaller targets. The structure may be further provided with embedded light conveying and directing elements such as reflectors, masks or lightguides when necessary on either or both substrates 102, 103. These elements may be mounted as pre-fabricated or directly produced, optionally by printing, on the host substrates.

Figure 5:
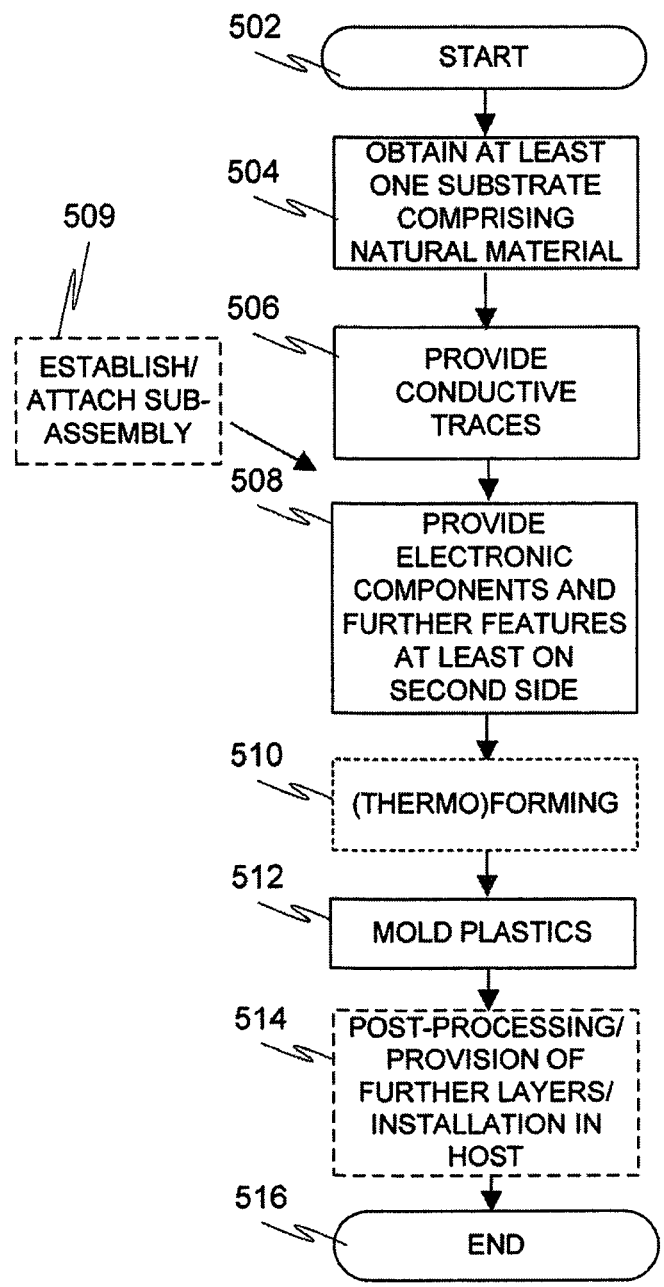
FIG. 5 is a flow diagram disclosing an embodiment of a method in accordance with the present invention.

FIG. 5 shows a flow diagram 500 disclosing an embodiment of a method in accordance with the present invention.

At the beginning of the method for manufacturing the multilayer structure, a start-up phase 502 may be executed. During start-up 502, the necessary tasks such as material, component, equipment and tools selection, acquisition, calibration and other configuration may take place. Specific care must be taken that the design, component and material selections work together and survive a selected manufacturing process, which is naturally preferably checked up-front on the basis of the manufacturing process specifications and e.g. component data sheets, or by investigating and testing a number of produced prototypes, for example. The used equipment such as molding/IML, lamination, bonding, (thermo)forming, electronics assembly, cutting, drilling and/or printing equipment, among others, may be thus ramped up to operational status already at this stage or later.

At 504, at least one, optionally film-type or thicker, substrate for accommodating electronics is obtained. As contemplated hereinbefore, in some embodiments only one substrate is sufficient whereas in some others, multiple substrates of potentially different materials are included in the multilayer structure. Not necessarily all substrates ultimately required will carry circuitry though. A ready-made element, e.g. a piece of wood such as veneer or plywood, cork, leather, or fabric (textile), may be acquired for use as substrate material. In some embodiments the substrate itself may be first produced in-house from the desired starting material(s) such as yarns in the case of textiles. A substrate may be substantially homogenous and contain essentially one material layer only of single natural material, or alternatively, it may contain additional layers of further materials laminated together to form a related stack. For example, a strengthening support layer may be provided (by lamination, spraying, printing, etc.) to add e.g. rigidity to the natural material such as leather or textile material. Some additional layers, e.g. coating with primer, may be used, for example, to prevent the natural material from excessively absorbing e.g. conductor material later printed thereon and/or to enhance their adhesion.

Initially the substrates may be substantially flat (essentially two-dimensional, meaning considerably modest thickness compared with length and width). Preferably the natural material(s) utilized, even if processed and/or supplemented with further layers such as varnish, film or other coating, exhibit at least to some extent their characteristic, naturally grown (considering e.g. wood) or natural textile based surface texture to suit applications wherein natural appearance and/or other properties arising from the natural material are desired in contrast to e.g. synthetic and artificial-looking materials.

The natural material(s) utilized e.g. as substrate(s) may optionally be thinned (e.g. at this stage or later). Thinning may enhance various properties including optical properties of the material, such as transmittance, or in practice translucency, of the material, which may enhance light glow or generally conveyance therethrough in embodiments having such motive. Thinning, optionally by lasering, may be executed selectively so that the natural material is not thinned equally everywhere. For example, locations corresponding to the locations of underlying light sensor or source, or positioned in the corresponding optical path anyway, may be thinned more than the remaining areas, which may be omitted from thinning completely or thinned to lesser extent. In some embodiments, thinning may be selectively applied so as to define a surface feature such as a graphical shape, text, number, symbol, icon in the natural material via the resulting recess(es) and/or naturally through-holes in extreme case. The feature may be then further highlighted by illuminating it by underlying light source to render it visible or at least enhance its visibility as explained hereinbefore in more detail.

At 506, a number of conductors such as conductor traces, electrodes and/or contact pads for electrically coupling electronic components, may be selectively provided on the substrate(s), preferably but not necessarily by one or more techniques of printed electronics technology. For example, screen, inkjet, flexographic, gravure or offset lithographic printing may be utilized. Also further actions cultivating the substrate(s) involving e.g. printing of graphics, visual indicators, etc. thereon may take place here. In some embodiments, graphics layers or masking layers may be, in addition to or instead of printing on a substrate, provided by laminating a separate graphics/opaque film or sheet onto the concerned substrate.

A person skilled in the art may find suitable manufacturing parameters such as printing parameters and applicable material characteristics of available natural materials by starting from ordinary ones commonly exploited in connection with plastic substrates, for example, and then through testing determine the optimal process parameters as well as printing materials for each use scenario.

At 508, a number of electronic components are provided, by mounting and/or printing, onto the substrate(s). Preferably at least the substrate residing, when in use, in the front is provided, at least on the second, i.e. back side thereof to be later overmolded, with e.g. a LED, control and/or sensing circuitry, whereas the first side thereof may optionally also contain a number of components and/or other circuitry, or remain free therefrom depending on the particular embodiment in question.

Ready-made components such as various SMDs may be attached to the contact areas on a substrate by solder and/or adhesives. Alternatively or additionally, printed electronics technology may be applied to actually manufacture at least part of the components, such as OLEDs, directly onto the substrate(s).

Yet, various further features such as lightguides or other optical elements may be provided to the substrate(s) at this stage or in connection with item 506 through mounting or direct fabrication via printing, for example.

Also connecting element(s) such as electrical connectors or contact pads for electrically connecting the multilayer structure to an external device (and/or several substrates together), such as a host device, may be prepared e.g. to the substrate(s) at this stage or subsequent to forming or molding.

Execution of various method items such as items 506 and 508 may in practice alternate or overlap in various embodiments as being clear to a person skilled in the art in the light of the previously described embodiments illustrated in FIGS. 1-4. For example, one side of a substrate may be first provided with traces, components and further features, even a molded layer (see item 512), prior to switching over to processing the opposite side potentially also including similar tasks.

Item 509 refers to possible attachment of one or more sub-systems or 'sub-assemblies' to the substrate(s). The sub-assemblies may incorporate an initially separate, secondary substrate provided with electronics such as IC(s) and/or various components. At least part of the electronics of the multilayer structure may be provided to the substrate(s) via such sub-assembly. Optionally, the sub-assembly may be at least partially overmolded by a protective plastic layer and/or covered by other material (e.g. epoxy) prior to attachment to the associated main substrate. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the host substrate.

At 510, one or more substrates preferably already containing the electronics such as various components and/or other circuitry are optionally formed to at least locally exhibit a desired, essentially three-dimensional, shape instead of the possibly initially planar one. Applicable forming methods include e.g. thermoforming and cold forming.

At 512, at least one, e.g. thermoplastic or thermosetting, material layer is molded upon the second side of the mandatory first substrate to at least partially cover the related surface and potential features thereon, such as traces, components and/or a graphics layer. In some embodiments where a second (back) substrate has been provided, optionally incorporating e.g. further electronics or other features, the plastic layer(s) may be molded between them. Alternatively, the second substrate may be afterwards laminated onto the molded layer in the back portion of the multilayer structure. Applicable molding techniques include e.g. injection molding (thermoplastic) and reaction injection molding (thermosets).

In practice, a substrate may be used as an insert e.g. in an injection molding process. In case two (first and second) substrates are used, both of them may be inserted in their own mold halves so that the plastic layer is injected between them.

Optionally, also the second side of the second substrate may be at least partially overmolded e.g. to embed the electronics and/or other features thereon within the plastic material for protection or some other reason. The order of successive molding operations may be selected by a skilled person so as to best fit each embodiment and related use scenario.

Optionally, one or more spacing elements may be utilized in connection with the molding procedure to guide, protect and/or separate selected features (electronics, vias/through-holes, optics, etc.) on the substrate(s) from the molded plastics and/or mold structures such as walls during molding to keep them clean from molded material and/or reduce stress induced thereto. Such spacing elements may be then removed or peeled off afterwards.

In some embodiments, forming of the substrate(s) may take place upon molding. The mold may comprise a number of features such as pins that first force the initially substrate(s) by the induced pressure to follow the mold (wall) shapes, thus forming the substrate(s). Generally having regard to forming of natural materials such as wood, moistening the material prior to molding may add to its formability.

To protect fragile features such as electronic components, the utilized overmolding technique may exploit relatively low molding pressure (e.g. 15 bars or less, more preferably about 10 bars or less). In less sensitive portions higher pressures may be utilized to yield different material properties.

In addition to or instead of overmolding, selected electronic components and/or other features may be protected by potting or resin dispensing, for example.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about one or a few millimeters, but considerably thicker or thinner embodiments are also fully feasible.

Item 514 refers to potential post-processing tasks. Further layers may be added to the multilayer structure by lamination or suitable coating (e.g. deposition) procedures. The layers may be of protective, indicative, tactile and/or aesthetic value (graphics, colors, figures, text, numeric data, surface profile, etc.). Additional elements such as electronics or connecting elements (e.g. electrical wiring, cabling) may be installed at the outer surface(s) of the structure, such as the exterior surface of a substrate in the back portion of the structure. Shaping/cutting may take place. The connecting elements may be connected to a desired external element such a connector of an external host device or host structure. The multilayer structure may be installed in a target device or structure (e.g. housing), if any.

At 516, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. The person will easily comprehend the fact that the above, merely exemplary, embodiments of the present invention may be flexibly and easily combined in terms of selected features to come up with further embodiments. Yet, further features may be introduced into the above or mixed embodiments.

The invention claimed is:

1. An integrated multilayer structure for hosting electronics, comprising:
    a 3d-formable first substrate fabricated from a substantially electrically-insulative, organic material, the first substrate having a first side, and an opposite second side;
    a plastic layer molded onto the second side of the first substrate to at least partially cover the first substrate, the plastic layer having a first side that faces the second side of the first substrate, and an opposite second side;
    a plastic second substrate disposed on the second side of the plastic layer; and
    a light source at least partially embedded in the plastic layer such that the light source is disposed between the first substrate and the second substrate, wherein the organic material of the first substrate comprises opaque material being at least locally configured to have a reduced thickness area to enable light emitted by the light source to glow through the first substrate and thereby towards an environment of the integrated multilayer structure on the first side of the first substrate.

2. The integrated multilayer structure according to claim 1, wherein the second substrate is a thermoplastic film.

3. The integrated multilayer structure according to claim 1, further comprising another light source disposed on the second side of the first substrate.

4. The integrated multilayer structure according to claim 3, wherein the another light source is at least partially embedded in the plastic layer.

5. The integrated multilayer structure according to claim 3, wherein the another light source has a first side and a second side each embedded in the plastic layer.

6. The integrated multilayer structure according to claim 3, wherein an entirety of the another light source is embedded in the plastic layer.

7. The integrated multilayer structure according to claim 1, wherein the light source is an LED.

8. The integrated multilayer structure according to claim 1, wherein the substantially electrically-insulative, organic material is selected from the group consisting of: wood, solid wood, veneer, plywood, bark, tree bark, birch bark, cork, natural leather, natural textile or fabric material, cotton, wool, linen, and silk.

9. The integrated multilayer structure according to claim 1, wherein the first substrate is thermoformable.

10. The integrated multilayer structure according to claim 1, wherein the overall structure exhibits a substantially non-planar, three-dimensional shape.

11. The integrated multilayer structure according to claim 1, wherein the second substrate defines a through-hole extending from a first side thereof to a second side thereof to allow light to pass therethrough.

12. The integrated multilayer structure according to claim 1, wherein the second substrate has a portion of a reduced thickness configured to allow light from the light source to pass therethrough.

13. The integrated multilayer structure according to claim 12, wherein the thickness of the portion of the second substrate is less than about 2 mm.

14. The integrated multilayer structure according to claim 1, wherein the first substrate has a thickness less than about 0.5 mm.

15. The integrated multilayer structure according to claim 1, further comprising a visual feature attached to the first side of the first substrate.

16. The integrated multilayer structure according to claim 1, further comprising a laminated thermoplastic disposed on the first side of the first substrate.

17. The integrated multilayer structure according to claim 1, further comprising a conductive material electrically connecting the first and second substrates to one another.

18. The integrated multilayer structure according to claim 1, wherein the reduced thickness area defines at least one of an illuminated graphical shape, text, number, symbol or icon on the first substrate.

19. The integrated multilayer structure according to claim 1, wherein the light glowing through the first substrate produces an illuminated indication on the first side of the first substrate, the indication being of a selected shape exhibiting at least one of a text, number, symbol, icon, graphical pattern, or figure.

20. An integrated multilayer structure for hosting electronics, comprising:
- a 3d-formable first substrate fabricated from a substantially electrically-insulative, organic material, the first substrate having a first side, and an opposite second side;
- a laminated thermoplastic disposed on the first side of the first substrate;
- a thermoplastic layer molded onto the second side of the first substrate to at least partially cover the first substrate, the thermoplastic layer having a first side that faces the second side of the first substrate, and an opposite second side;
- a second substrate disposed on the second side of the thermoplastic layer;
- a light source coupled to the second side of the first substrate and embedded in the thermoplastic layer such that the light source is disposed between the first substrate and the second substrate; and
- another light source at least partially embedded in the thermoplastic layer and coupled to the second substrate, wherein the organic material of the first substrate comprises opaque material being at least locally configured to have a reduced thickness area to enable light emitted by the light source to glow through the first substrate and thereby towards an environment of the integrated multilayer structure on the first side of the first substrate.

21. The integrated multilayer structure according to claim 20, wherein the light source is embedded in the first side of the thermoplastic layer, and the another light source is embedded in the second side of the thermoplastic layer, wherein the light source and the another light source are offset from one another.

* * * * *